(12) United States Patent
Hata et al.

(10) Patent No.: US 6,691,401 B2
(45) Date of Patent: Feb. 17, 2004

(54) DEVICE FOR MOUNTING COMPONENTS

(75) Inventors: Kanji Hata, Katano (JP); Shiro Oji, Osaka (JP); Shigetoshi Negishi, Suita (JP); Makito Seno, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 356 days.

(21) Appl. No.: 09/769,788

(22) Filed: Jan. 25, 2001

(65) Prior Publication Data

US 2001/0003865 A1 Jun. 21, 2001

Related U.S. Application Data

(62) Division of application No. 09/281,468, filed on Mar. 30, 1999, now Pat. No. 6,195,878.

(30) Foreign Application Priority Data

Apr. 2, 1998 (JP) .............................................. 10-89648
Oct. 26, 1998 (JP) ........................................... 10-303562

(51) Int. Cl.[7] ................................................. B23P 19/00
(52) U.S. Cl. ............................. 29/743; 29/740; 29/739; 29/759; 29/DIG. 44; 294/2; 294/64.1; 414/737
(58) Field of Search ........................ 29/743, 740, 739, 29/759, 721, 33 M, 742, 832, 834, DIG. 44; 294/2, 64.1; 901/40; 414/225, 737

(56) References Cited

U.S. PATENT DOCUMENTS

| | | | |
|---|---|---|---|
| 4,809,430 A | 3/1989 | Maruyama et al. | |
| 4,999,909 A | 3/1991 | Eguchi et al. | |
| 5,193,268 A | 3/1993 | Ono et al. | |
| 5,313,401 A | 5/1994 | Kasai et al. | |
| 5,329,692 A | 7/1994 | Kashiwagi | |
| 5,365,452 A | 11/1994 | Imafuku et al. | |
| 5,402,564 A | 4/1995 | Tsukasaki et al. | |
| 5,579,572 A | 12/1996 | Kashiwagi et al. | |
| 5,628,107 A | 5/1997 | Nushiyama et al. | |
| 5,758,410 A * | 6/1998 | Asai et al. ..................... | 29/740 |
| 5,761,798 A | 6/1998 | Suzuki | |
| 5,784,778 A * | 7/1998 | Yoshida et al. ................ | 29/743 |
| 5,867,897 A | 2/1999 | Mimura et al. | |
| 5,979,045 A | 11/1999 | Nishimori et al. | |
| 6,260,260 B1 * | 7/2001 | Suhara ........................ | 29/740 |

* cited by examiner

Primary Examiner—Peter Vo
Assistant Examiner—Minh Trinh

(57) ABSTRACT

A device for mounting components using mounting heads having a plurality of suction nozzles that provide a plurality of component pickups, positions or mounting operating positions. The mounting heads are positioned on a rotating table that is cooperatively positioned adjacent a component supply table having a plurality of component feeder members. The control unit can rotate the rotating table to position a mounting head at a component supply position and further position one of the plurality of suction nozzles to a first, second and third section operating position for picking up a component from a component feeder. The relative movement of the component supply table and the positioning of first and second suction operating positions relative to our reference point where the edge of the rotating table contacts the line of movement of the component supply table can increase the pickup speed of components.

10 Claims, 10 Drawing Sheets

Fig. 6A
Fig. 6B
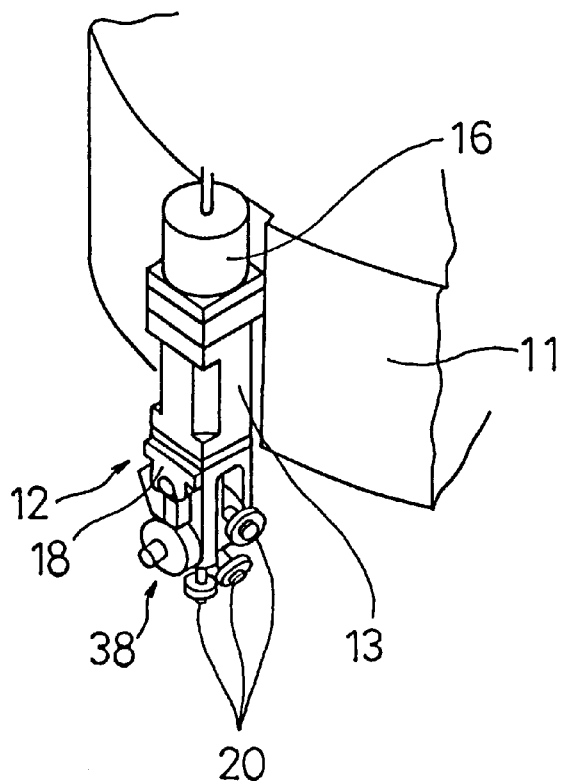
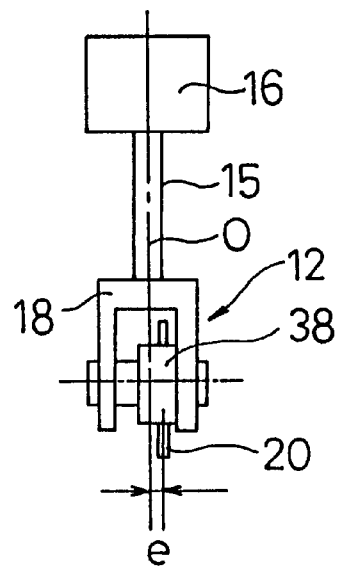

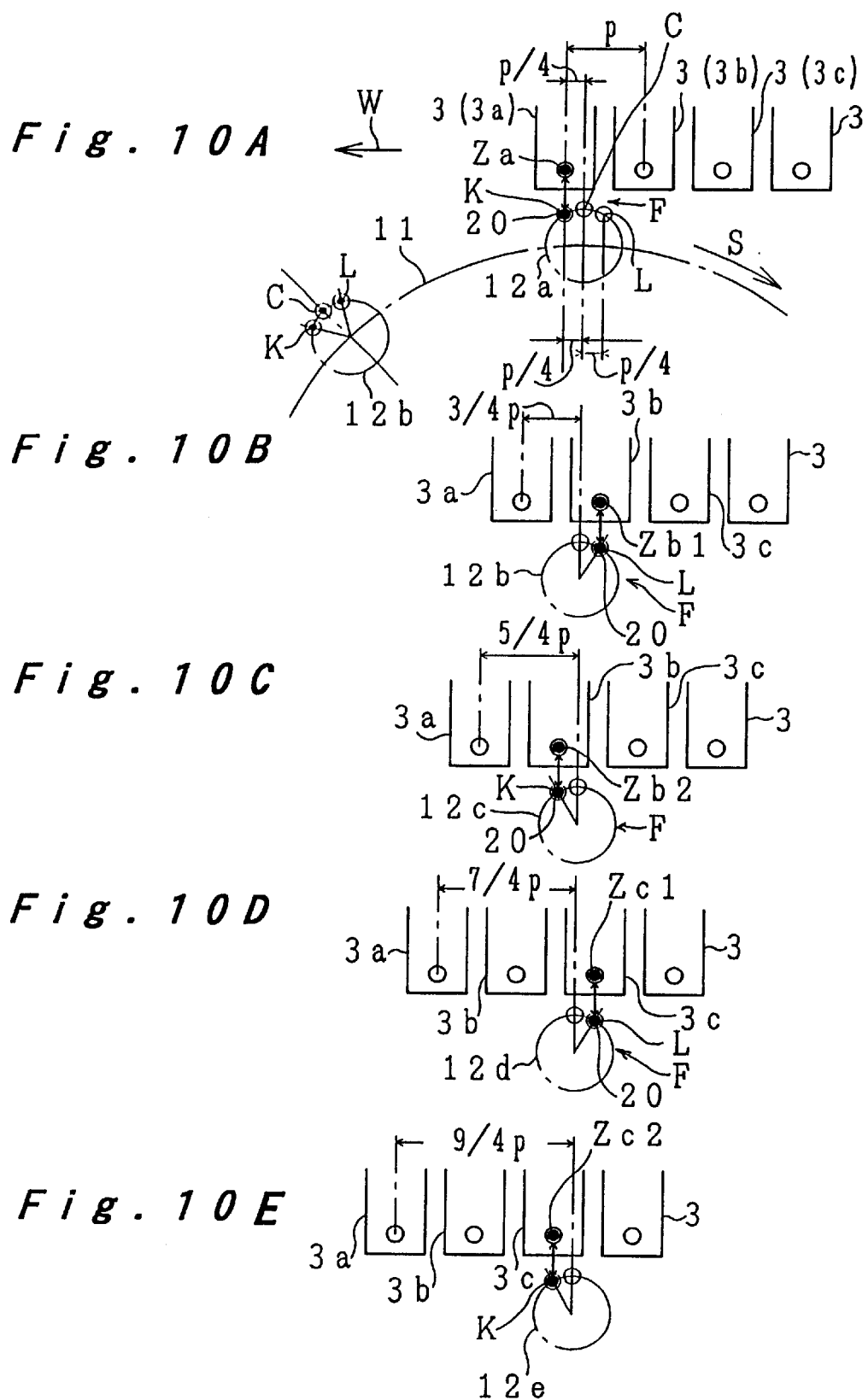

DEVICE FOR MOUNTING COMPONENTS

The is a divisional application of U.S. Ser. No. 09/281,468 filed on Mar. 30, 1999, now U.S Pat. No. 6,195,878, issued Mar. 6, 2001.

BACKGROUND OF THE INVENTION

1. Field of the Invention

The present invention relates to a method and device for mounting components whereby components such as electronic components, or the like, are mounted onto a substrate.

2. Description of the Related Art

As shown in FIG. 7, a conventional high-speed-type electronic component mounting device is generally constituted in such a manner that a component is extracted at a mounting section 1 from a desired component feeder 3 of a component supplying section 2, and the component is mounted automatically onto a substrate 5 set on an XY table 4. Numeral 6 denotes a transporting rail for transporting the substrate 5 to and from the device, and numeral 7 denotes a display section for displaying the operational state and any irregular states of the component mounting device.

As shown in FIG. 8, in the component supplying section 2, a plurality of component feeders 3, into which component reels 8, wherein components are held on a tape and wound into a reel, are set, are mounted on a component feeder table 9 which is movable in leftward and rightward directions. The component feeder table 9 being constituted in such a manner that any desired component feeder 3 can be located in a component supply position 10, which is determined at a certain point, by moving the component feeder table 9 along a guide rail 9a. In the mounting section 1, a plurality of mounting heads 12 are provided on the outer circumference of a rotating table 11, which rotates intermittently, a component in the component feeder 3 located at the aforementioned component supply position 10 is picked up and held by a suction nozzle provided on a mounting head 12, whereupon the rotating table 11 rotates and the component held by suction is mounted to a substrate 5 located in position by the XY table 4, at the point that the mounting head 12 comes to rest in the component mounting position.

A single suction nozzle or a plurality of suction nozzles are provided on each mounting head 12. In case a plurality of suction nozzles are provided, then the device is constructed in such a manner that a suction nozzle dedicated to a type of component can be selected. In either case, the device is constituted in such a manner that the single suction nozzle or the selected suction nozzle locates in the component suction position or the component mounting position when a mounting head 12 comes to rest in the component suction position or component mounting position, the operations of component suction and component mounting being carried out by an upward and downward action of the mounting head 12.

However, in recent years, even higher component mounting speed has been demanded, and in this case, whilst it is relatively simple to shorten the movement time of the mounting heads 12 by increasing the speed of rotation of the rotating table 11 in the mounting section 1, the time that can be used for moving the component supply table 9 and the XY table 4 is more restricted than the movement time for the mounting heads, and therefore it is difficult to shorten this movement time any further. In other words, movement of the component supply table 9 can only be started after a component has been picked up by the suction nozzle and raised to a prescribed height, and the movement thereof must be completed before the next suction nozzle descends to a position which is a prescribed height above the component suction height. The time which can be used for movement of the XY table 4 is similarly restricted in the case of component mounting. It is extremely difficult to shorten this movement time further, because improvement in the movement speed of the component supply table 9 and the XY table 4 is already approaching its limit. Therefore, whilst it is necessary to shorten the distance of movement of the component supply table 9 and the XY table 4 in order to increase the speed of component mounting, this is not possible with a conventional device construction, and therefore presents a major impediment to achieving higher speeds for component mounting.

SUMMARY OF THE INVENTION

In view of the forgoing problems of the prior art, an object of the present invention is to provide a method and device for mounting components, whereby increases in mounting speed can be achieved by reducing the movement distance of the component feeder and the substrate.

The method for mounting components according to the present invention is a method for mounting components, whereby a component is picked up by a suction nozzle provided in a mounting head moving intermittently by rotation along a uniform path, when the mounting head comes to rest in a prescribed component supply position, and the component held by suction is mounted to a substrate when the mounting head comes to rest in a prescribed component mounting position, comprising: using a mounting head constructed such that a plurality of suction operating positions are set for the suction nozzle when the mounting head comes to rest in the component supply position, a first step of selecting a component supply position such that the amount of movement of component feeder holding a component to be mounted next becomes a minimum, and moving the component feeder accordingly; and a second step of selecting a suction nozzle position in accordance with the component supply position in the first step, whilst the mounting head is moving towards the component suction position, any of these suction operating positions being selectable; thereby enabling the amount of movement of the component feeder towards the component supply position to be reduced and the movement time to be shortened accordingly, and hence allowing increases in mounting speed to be achieved.

Moreover, by using a mounting head, wherein a plurality of mounting operating positions are set for the suction nozzle when the mounting head comes to rest in the component mounting position, any of these suction operating positions being selectable, and by comprising: a first step of selecting a component mounting position such that the amount of movement of the substrate towards the mounting position for the component to be mounted next becomes a minimum, and moving the substrate accordingly; and a second step of selecting a suction nozzle position in accordance with the component mounting position in the first step, whilst the mounting head holding the component by suction is moving towards the component mounting position; the amount of movement of the component feeder towards the component supply position can be reduced and the movement time can be shortened accordingly, thereby allowing increases in mounting speed to be achieved.

Furthermore, by using a mounting head wherein a plurality of suction or mounting operating positions are set for the suction nozzle when the mounting head comes to rest in the component supply position or the component mounting position, any of these suction or mounting operating positions being selectable, and by comprising: a first step of selecting a component supply position such that the amount of movement of component feeder holding a component to be mounted next becomes a minimum, and moving the component feeder accordingly; a second step of selecting a suction nozzle position in accordance with the component suction position in the first step, whilst the mounting head is moving towards the component suction position; a third step of selecting a component mounting position such that the amount of movement of the substrate towards the mounting position for the component to be mounted next becomes a minimum, and moving the substrate accordingly; and a fourth step of selecting a suction nozzle position in accordance with the component mounting position in the third step, whilst the mounting head holding the component by suction is moving towards the component mounting position; the amount of movement of the component feeder towards the component supply position can be reduced and the movement time can be shortened accordingly, thereby allowing increases in mounting speed to be achieved.

Moreover, the device for mounting components according to the present invention is a device for mounting components, whereby a component is picked up by a suction nozzle provided in a mounting head moving intermittently by rotation along a uniform path, when the mounting head comes to rest in a prescribed component supply position, and the component held by suction is mounted to a substrate when the mounting head comes to rest in a prescribed component mounting position, wherein the mounting head comprises a device for setting a plurality of suction nozzle positions for suction operations or mounting operations when the mounting head is at rest in the component supply position or component mounting position, and selecting one of these suction nozzle positions, thereby enabling the aforementioned methods to be implemented by selecting the suction nozzle position and hence enabling high-speed mounting to be achieved.

Specifically, by providing a rotating member capable of rotating about a vertical axis of rotation in the mounting head, and providing suction nozzles in positions on the rotating member which are displaced eccentrically from the axis of rotation, it is possible to select the operating position of a suction nozzle by rotating the rotating member.

Moreover, by providing a nozzle block, which is capable of being positioned rotationally about an oblique axis of rotation intersecting obliquely with the axis of rotation of the rotating member and comprises suction nozzles of plural types arranged on the circumference thereof, on the rotating member, in such a manner that a desired suction nozzle can be located selectively in a position that is parallel to and eccentric from the aforementioned axis of rotation by rotating the nozzle block, it is possible to select an appropriate suction nozzle by rotating the nozzle block according to the type of component, and moreover, it is also possible to select the operating position of the suction nozzle by rotation of the rotating member.

By providing suction nozzles of plural types on the circumference of the rotating member in parallel with the axis of rotation thereof, and providing a device for switching the vertical position of each suction nozzle, it is possible to select an appropriate suction nozzle by selecting the vertical position of each suction nozzle according to the type of component, and moreover, it is also possible to select the operating position of that suction nozzle by rotation of the rotating member.

Moreover, if a nozzle block, which is capable of being positioned rotationally about an horizontal axis of rotation intersecting orthogonally with the axis of rotation of the rotating member and comprises suction nozzles of plural types arranged on the circumference thereof, is provided on the rotating member, the nozzle block being constituted in such a manner that the plane in which the suction nozzles are installed is displaced from the axis of rotation of the rotating member and any of the suction nozzles can be located to a position parallel to the axis of rotation by rotating the nozzle block, it is possible to select an appropriate suction nozzle by rotating the nozzle block according to the type of component, and moreover, it is also possible to select the operating position of that suction nozzle by rotation of the rotating member.

Furthermore, the method for mounting components according to the present invention is a method for mounting components, whereby a plurality of mounting heads provided on the circumference of a rotating table rotating intermittently in one direction come to rest successively in a component supply position, whilst, of a plurality of component feeders mounted in a sequential fashion on a component feeder table which moves in a direction contacting the rotating edge of the rotating table, component feeder supplying components that are to be picked up come to rest successively in a prescribed position, a component being picked up from the component feeder by a suction nozzle provided in the mounting head in the aforementioned component supplying position, and the component held by suction being mounted to a substrate when the mounting head reaches a component mounting position by means of the intermittent rotation of the rotating table, wherein the mounting heads used are constituted in such a manner that, for the suction operating position for the suction nozzle when the mounting head is at rest in the component supply position, it is possible to select any one of two positions from a first suction operating position displaced upstream in the direction of rotation of the rotating table from a reference point where the rotating edge of the rotating table contacts the line of movement direction of the component supply table, and a second suction operating position displaced downstream in the direction of rotation of the rotating table from the reference point, the component supply table is moved in pitch movements in the opposite direction to the direction of rotation of the rotating table. In a first cycle, a mounting head for which the first suction operating position has been selected picks up a component from a component feeder located in a corresponding position; in a second cycle, the second suction operating position is selected for the next mounting head reaching the component supply position, and the mounting head picks up a component from the next component feeder which has been located in a corresponding position by a pitch movement; in a third cycle, the first suction operating position is selected for the third mounting head reaching the component supply position, and the mounting head picks up a further component from the component feeder used in the second cycle and located in a corresponding position by a pitch movement; in a fourth cycle, the second suction operating position is selected for the fourth mounting head reaching the component supply position, and the mounting head picks up a component from a third component feeder which has been located in a corresponding position by a pitch movement; and subsequently, a component is picked up from a third component feeder by the next mounting head reaching the component supply position, in a similar manner to the first cycle, whereupon the process of picking up components is carried out by repeating the aforementioned cycles. The amount of movement per cycle of a component supply tape, which is heavy in weight and thus is difficult to be moved in an increased mounting speed, can be reduced, and hence the movement time can be shortened accordingly, and increases in mounting speed can be achieved.

In the aforementioned invention, if the displacement of the first suction operating position and the second suction operating position from the reference point is taken as p/4, respectively, and a single pitch movement of the component supply table is taken as p/2, when the pitch between the component feeder on the component supply table is taken as p, it is possible to halve the amount of movement of the component supply table compared to the prior art, and hence significant increases in mounting speed can be achieved, in addition to which the pitch movement of the component supply table can be set appropriately to a uniform value of p/2.

In the aforementioned invention, if plural rows of component assembly tapes are provided in a single parts cassette, each respective component assembly tape constituting component feeder, the actual pitch p between the component feeder can be reduced, thereby contributing to the achievement of increased mounting speeds.

In the foregoing methods for mounting components according to the present invention, when the component suction operation in any one of the first cycle–fourth cycle is repeated in a state where the component supply table is at rest, a corresponding suction operating position is selected for the next mounting head arriving at the component supply position, in such a manner that components supplied by the same component feeder are picked up, thereby making it possible to conform to an actual operational state.

Furthermore, the device for mounting components according to the present invention is a device for mounting components, whereby a plurality of mounting heads provided on the circumference of a rotating table rotating intermittently in a single direction come to rest successively in a component supply position, whilst, of a plurality of component feeders mounted in a sequential fashion on a component feeder table which moves in a direction contacting the rotating edge of the rotating table, component feeder supplying components that are to be picked up come to rest successively in a prescribed position, a component being picked up from the component feeder by a suction nozzle provided in the mounting head in the aforementioned component supplying position, and the component held by suction is recognized by a component recognition camera when the mounting head reaches a component recognition position by means of the intermittent rotation of the rotating table, whereupon the component held by suction is mounted to a substrate when the mounting head reaches a component mounting position, wherein the mounting heads used are constituted in such a manner that, for the suction operating position for the suction nozzle when the mounting head is at rest in the component supply position, it is possible to select any one of three positions from a first suction operating position displaced upstream in the direction of rotation of the rotating table from a reference point where the rotating edge of the rotating table contacts the line of movement direction of the component supply table, a second suction operating position displaced downstream in the direction of rotation of the rotating table from the reference point, and a third suction operating position, which is the position of the aforementioned reference point, and when the mounting head is in the component recognition position and the component mounting position, component recognition and component mounting are carried out by positioning the suction nozzle at the aforementioned reference point, regardless of the suction operating position. Therefore, when a component is picked up in the first or second suction operating positions, in addition to achieving increased mounting speed, as stated previously, when the component is picked up in the third suction operating position, it is possible to carry out component recognition using the recognition camera whilst maintaining a correct suction attitude.

In particular, if the suction operating position of the mounting head is selected according to the size of the component and more specifically, if the third suction operating position is selected for larger components having sides 5 mm or more in length, it is possible to prevent problems, such as a portion of larger components projecting outside the field of view of the recognition camera. In other words, supposing that a large component is picked up at the first or second suction operating position, and at the component recognition position, it is recognized by the recognition camera that the suction nozzle is in a state where it has moved to the reference point, then the attitude of the large component will be inclined by the angle of movement of the suction nozzle, so an angle of inclination corresponding to the aforementioned movement angle will arise between the reference center line of the field of view of the recognition camera and the reference center line of the larger component, thereby causing a problem in that a portion of the larger component will lie outside the field of view of the recognition camera. By picking up only large components at the third suction operating position, it is possible to carry out component recognition in a state where the reference center line of the component matches the reference center line of the field of view of the recognition camera, and consequently, in addition to resolving the aforementioned problems, it is possible to achieve increases in mounting speeds for smaller components also.

These and other objects, features and advantages of the invention will become more apparent upon a reading of the following detailed description and drawings.

BRIEF DESCRIPTION OF THE DRAWINGS

FIG. 6A is a perspective view and 6B is a schematic side view, both illustrating a mounting head of electronic component mounting device according to yet a further embodiment of the present invention;

FIGS. 10A–10E are illustrative diagrams showing the component mounting method according to the present invention in sequence.

DESCRIPTION OF PREFERRED EMBODIMENTS

Figure 7:
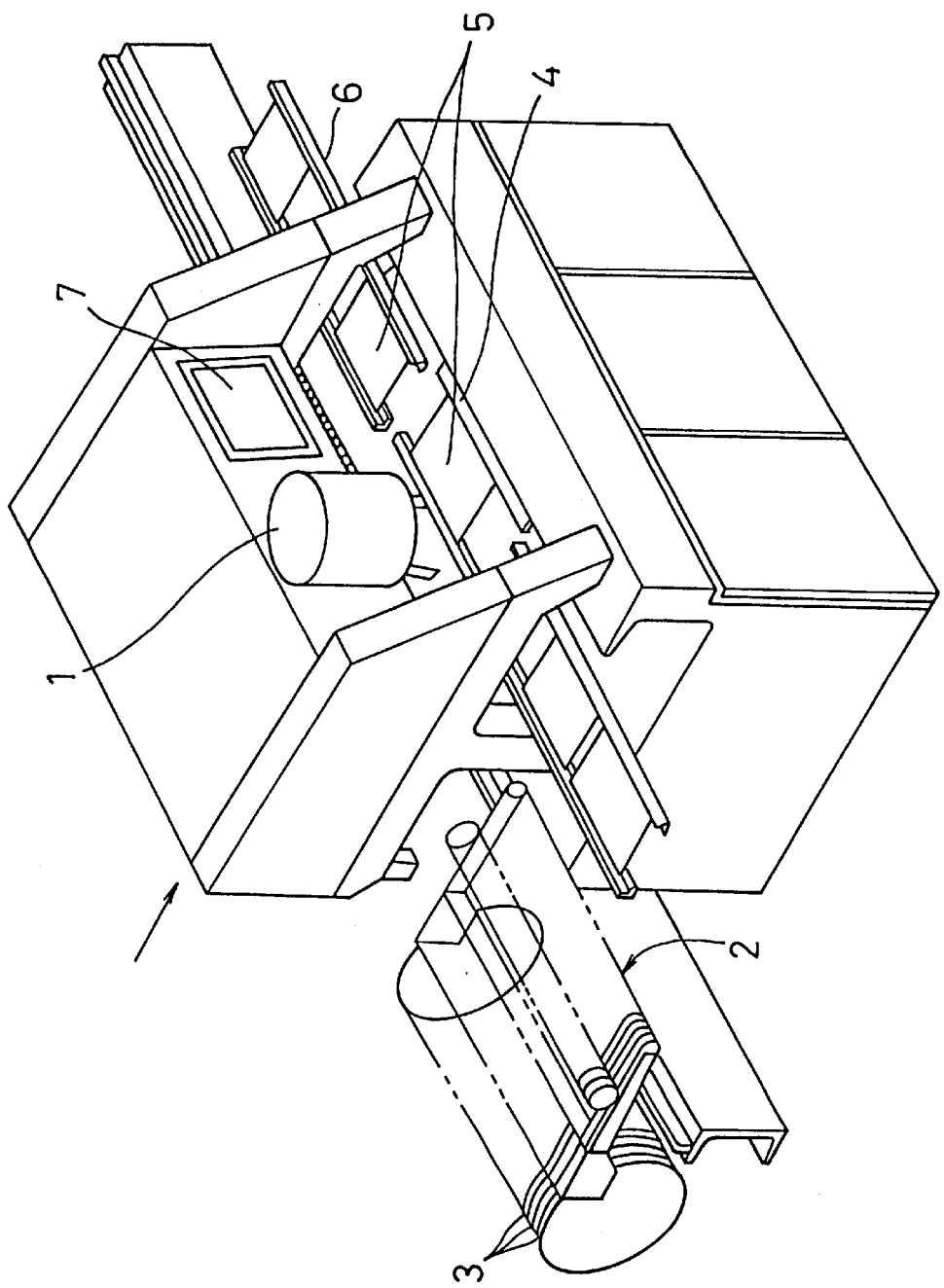
FIG. 7 is a perspective view showing the overall schematic construction of a prior art electronic component mounting device.
Figure 8:
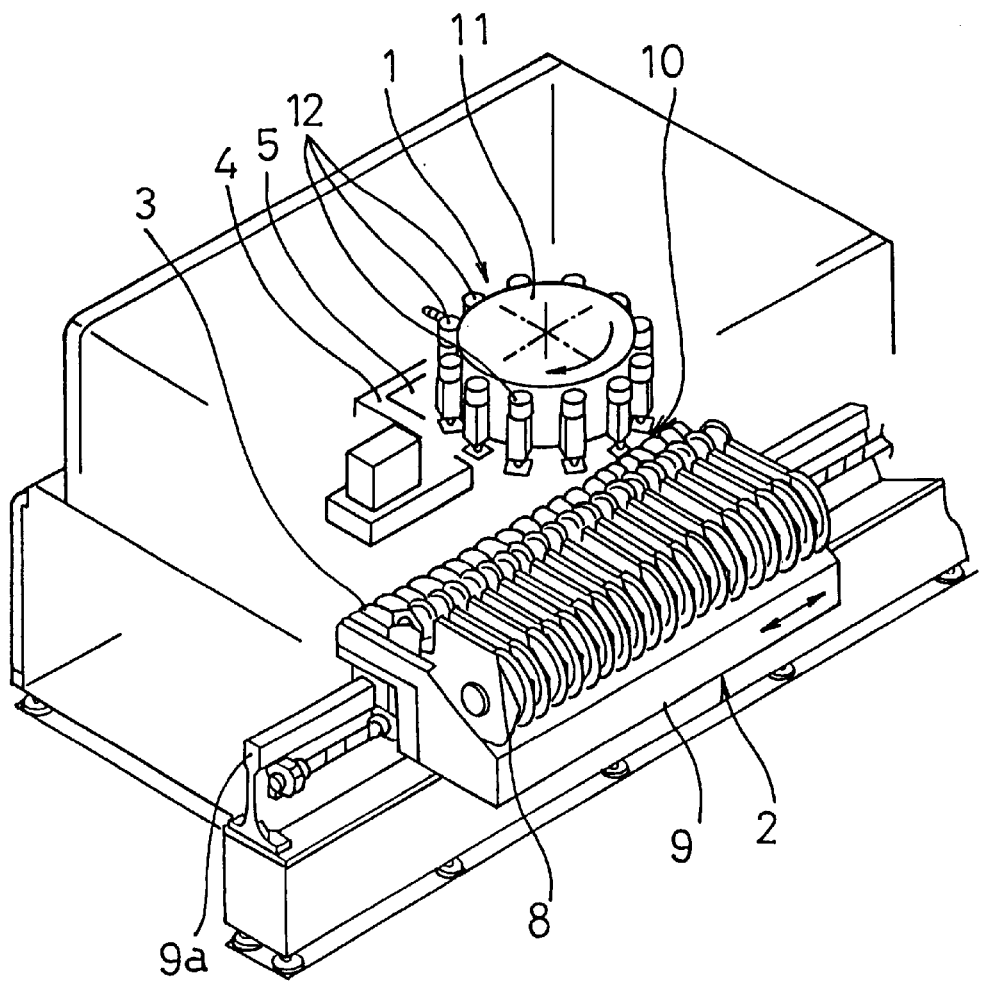
FIG. 8 is a perspective view showing a component supplying section and mounting section in the same prior art example.

Below, the method and device for mounting electronic components according to the present invention is described with reference to FIG. 1–FIG. 4. The overall construction of the device for mounting electronic components is substantially the same as the prior art example described with reference to FIG. 7 and FIG. 8, and hence the description thereof is omitted here and only the characteristic features of the present embodiments are explained.

Figure 1:
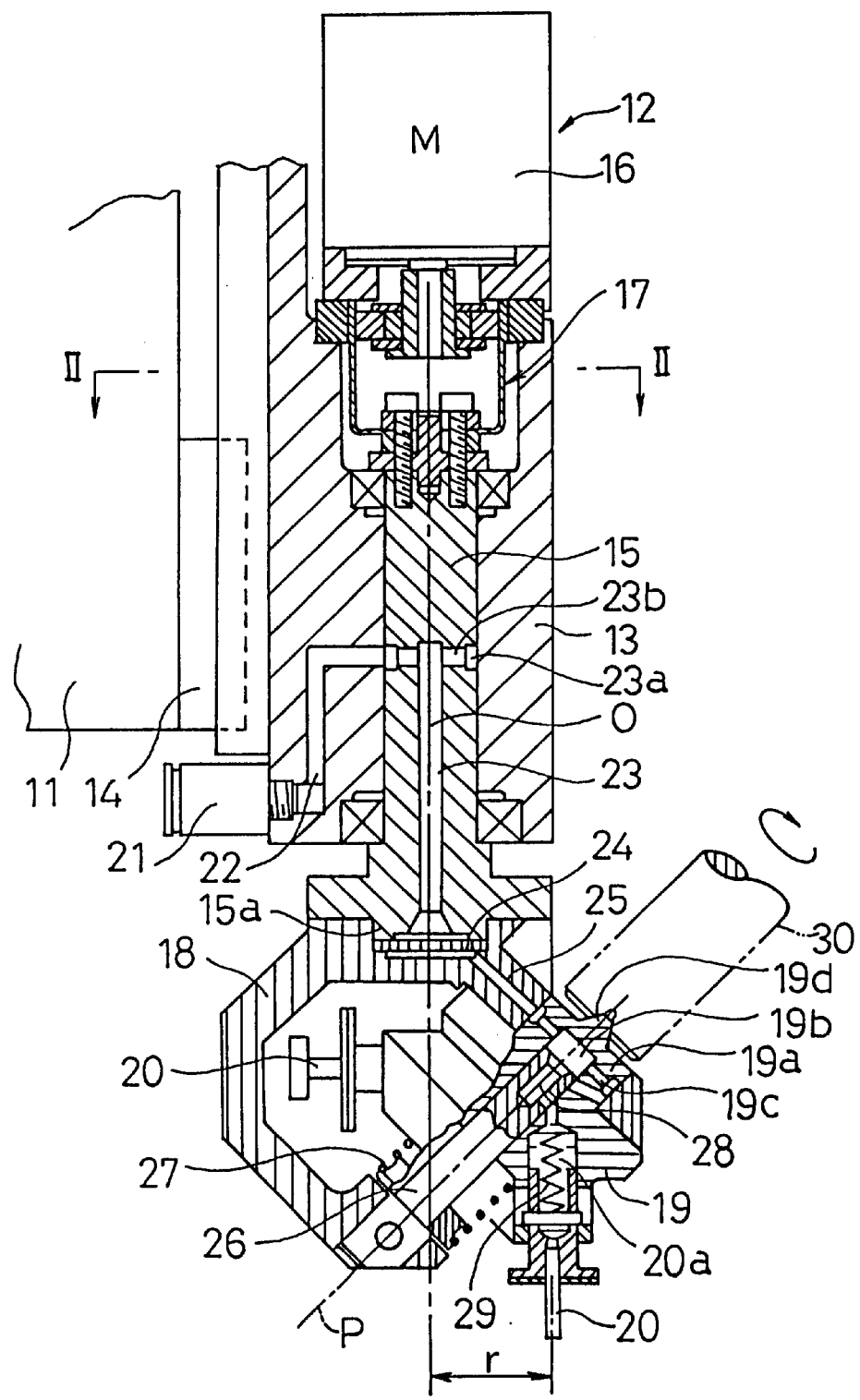
FIG. 1 is a front vertical section of a mounting head of an electronic component mounting device according to one embodiment of the present invention.
Figure 2:
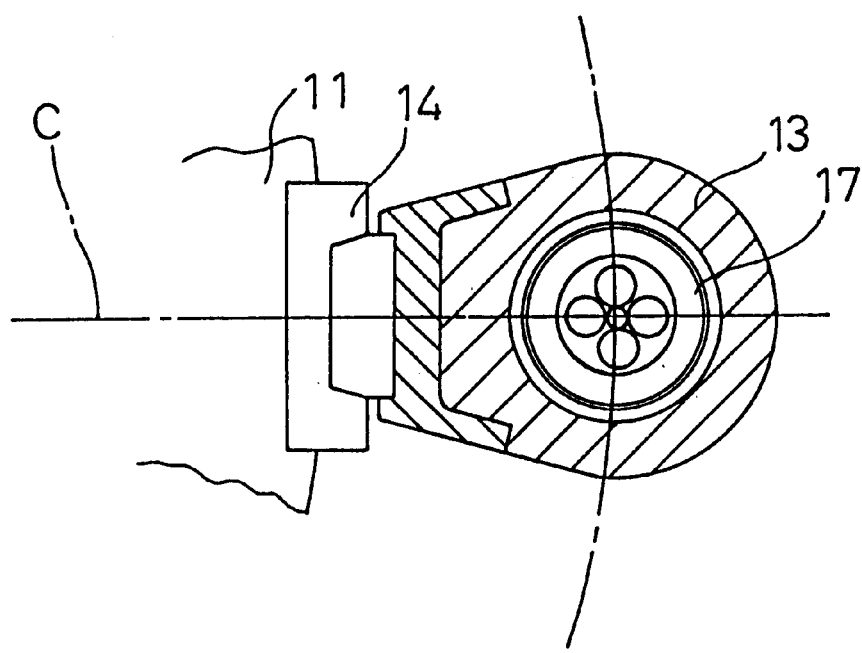
FIG. 2 is a horizontal section in plan view at line II—II in FIG. 1.

In FIG. 1 and FIG. 2, a plurality of mounting heads 12 are provided at regular intervals on the outer periphery of a rotating table 11 in a mounting section 1. Numeral 13 denotes the main section of a mounting head 12, which is held on the rotating table 11 such that it is movable in an upward and downward direction by means of a sliding guide 14, and a cam follower (not shown) which engages with a grooved cam (not shown) provided on the periphery of the rotating table 11 is mounted to the upper portion of this main section 13, such that the mounting head 12 moves upwards and downwards with the rotation of the rotating table 11, for the purpose of component suction, component mounting, or the like.

A rotating shaft 15 is provided on the main section 13 rotatably about a vertical axis of rotation O, and it is constituted such that it can be rotated in a forward or reverse direction by a motor 16 provided in the upper portion of the main section 13, via a gear reduction mechanism 17, such as a harmonic gear reduction mechanism, or the like. A rotating unit 18 is fixed to the lower end of the rotating shaft 15. A nozzle block 19, which can be located rotationally about an oblique axis P that intersects with the axis of rotation O of the rotating shaft 15 and in which suction nozzles 20 of plural types are arranged, is provided in the rotating unit 18. A desired suction nozzle 20 can be located selectively in a position that is parallel to the axis of rotation O and displaced therefrom by a prescribed radius, r, by rotating the aforementioned nozzle block 19.

Figure 3:
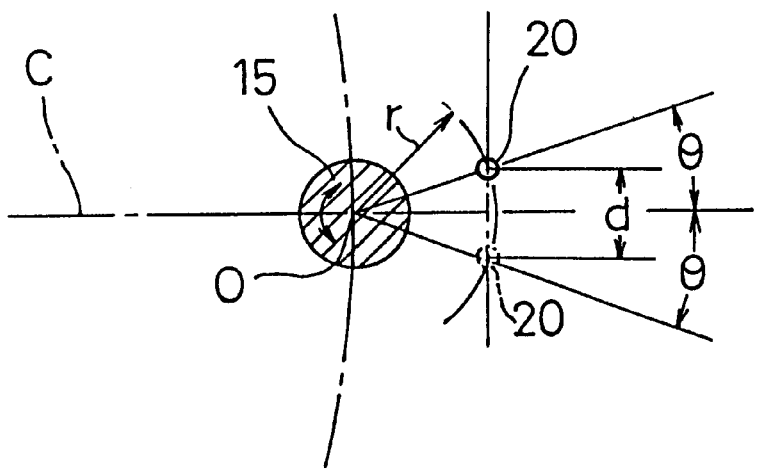
FIG. 3 is an illustrative diagram of a state where a suction nozzle switches position in the same embodiment.

As shown in FIG. 3, by rotating the rotating shaft 15 through an angle of ±θ from the original position thereof, it is possible to change the position of a suction nozzle 20 by a distance of d (=2r sin θ) about a center line C passing through the center of rotation of the rotating table 11.

In FIG. 1, 21 is a connector for connecting suction air mounted to the lower end of the main section 13, 22 is an air passage provided in the main section 13, and 23 is an air passage provided in the rotating shaft 15. An annular groove 23a and a radial groove 23b are provided in the outer circumference of the rotating shaft 15 at the upper end of the air passage 23, in such a manner that connection with the air passage 22 is ensured even if the rotating shaft 15 is rotated. 24 is a filter provided on the lower end of the rotating shaft 15, and 25 is an air passage formed in the rotating unit 18 in such a manner that it connects an interlocking section 15a at the lower end of the rotating shaft 15 with a bearing section 19a in the nozzle block 19.

26 is a rotating shaft of the nozzle block 19, one end of which is inserted into a hole with a bottom 19b which also forms an air passage bored in the axial position of the nozzle block 19 on the opposite side to the bearing section 19a, and the other end of which is fixed to the rotating member 18. 27 is a spring which is provided between the rotating unit 18 and the nozzle block 19 and presses the nozzle block 19 to the bearing section 19a side thereof. An air passage 19c comprising an annular groove and a radial hole is formed in the bearing section 19a of the nozzle block 19 as to allow the air passage 25 to communicate with the hole with a bottom 19b even when the nozzle block 19 is rotated. A further air passage 28, connecting the hole with a bottom 19b with the air passage 20a of the suction nozzle 20 located in a downward facing position in the nozzle block 19, is formed in the rotational shaft 26. 29 is a spring which presses the suction nozzle 20 downwards such as to allow the suction nozzle 20 to be retracted upwards.

Moreover, a coupling boss 19d projects from the end face of the bearing section 19a of the nozzle block 19 and is constituted in such a manner that by rotating the nozzle block 19 by means of a rotation operating shaft 30 which engages with this coupling boss 19d at a prescribed position at which the suction head 12 comes to rest, a desired suction nozzle 20 can be selected and set in a vertical downward-facing operational state.

Figure 4A:
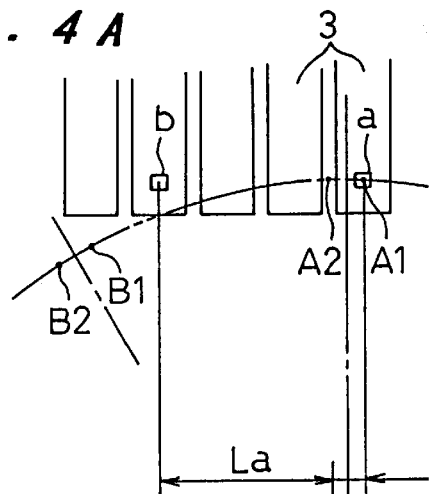
FIGS. 4A–4D are illustrative diagrams of a component supply process in the same embodiment and the prior art, respectively.
Figure 4B:
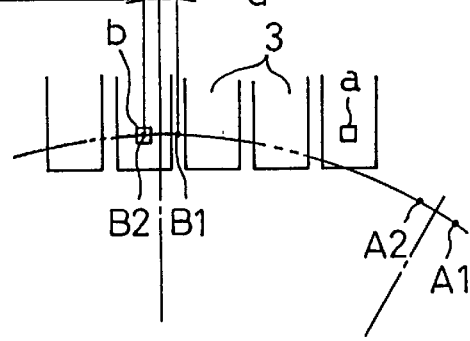

The operation according to the foregoing construction is now described in comparison to a prior art example, with reference to FIGS. 4A–4D. In a case where component a is currently held by suction and component b is subsequently to be held by suction, in the present embodiment, A1 of the suction nozzle positions A1 and A2 is selected in the mounting head 12 which is at rest in the component supply position, and the component a is picked up accordingly, as shown in FIG. 4A. On the other hand, the component feeder 3 holding component b which is to be picked up next is positioned apart from the component feeder 3 holding component a, to the upstream side in the direction of rotation of the rotating table 11. Therefore, in addition to selecting the component supply position in such a manner that the amount of movement of the component feeder 3 holding component b which is to be mounted next becomes a minimum, and moving the component feeder by a distance of La, as shown in FIG. 4B, in the subsequent mounting head 12, position B2 of the suction nozzle positions B1, B2 is selected by rotating the rotating shaft 15 whilst the subsequent mounting head 12 is moving towards the component supply position, and component b is picked up accordingly at the suction nozzle position B2.

Figure 4C:
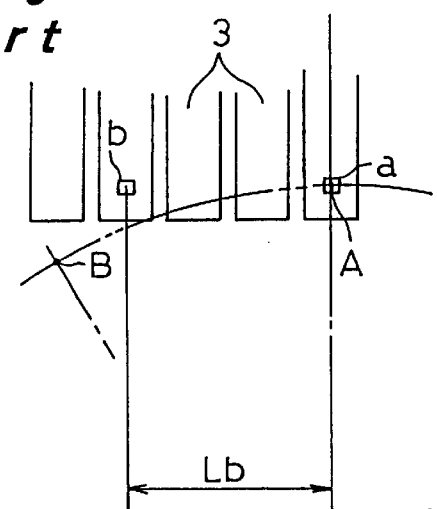
Figure 4D:
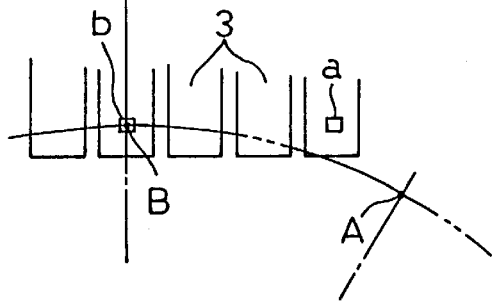

On the other hand, in the prior art example, as shown in FIG. 4C, the suction nozzle in the mounting head 12 which is at rest in the component supply position simply picks up component a at suction nozzle position A, and wherever the component feeder 3 holding component b which is to be picked up next may be positioned, before next component suction operation, the component feeder 3 holding component b is moved through a distance Lb to the component supply position, as shown in FIG. 4D, and component b is picked up in the component supply position, at suction nozzle position B.

Thus, in the present embodiment, the amount of movement of the component feeder 3 until reaching the component supply position can be reduced by the distance d (see FIG. 3) between the selected positions A1 and A2 of the suction nozzle 20, namely, to the amount of movement La, compared to Lb in the prior art, and hence the movement time can be shortened accordingly and increased mounting speed can be achieved.

The foregoing description related to a case where components are picked up in the component supply section 2, but in the operation of mounting components onto a substrate 5 on the XY table 4 also, the movement distance of the XY table 4 can similarly be reduced and the movement time therefor shortened accordingly, by selecting the operational position of the suction nozzle 20 in accordance with the subsequent mounting position. In other words, in addition to selecting the component mounting position such that the amount of movement of the substrate 5 until it reaches the next component mounting position becomes a minimum, and moving the substrate 5 by means of the XY table 4 accordingly, by selecting the position of the suction nozzle 20 in accordance with the aforementioned selected component mounting position whilst the mounting head 12 is moving towards the component mounting position after the component has been picked up, it is possible to reduce the amount of movement of the substrate 5 until it reaches the component mounting position and hence the movement time can be shortened accordingly, and increases in mounting speed can be achieved.

Next, a further embodiment of the invention is described with reference to FIG. 5. Like elements having the same function as those of the foregoing embodiment are given the same reference numerals and description thereof is omitted here, only the points of difference being explained.

Figure 5:
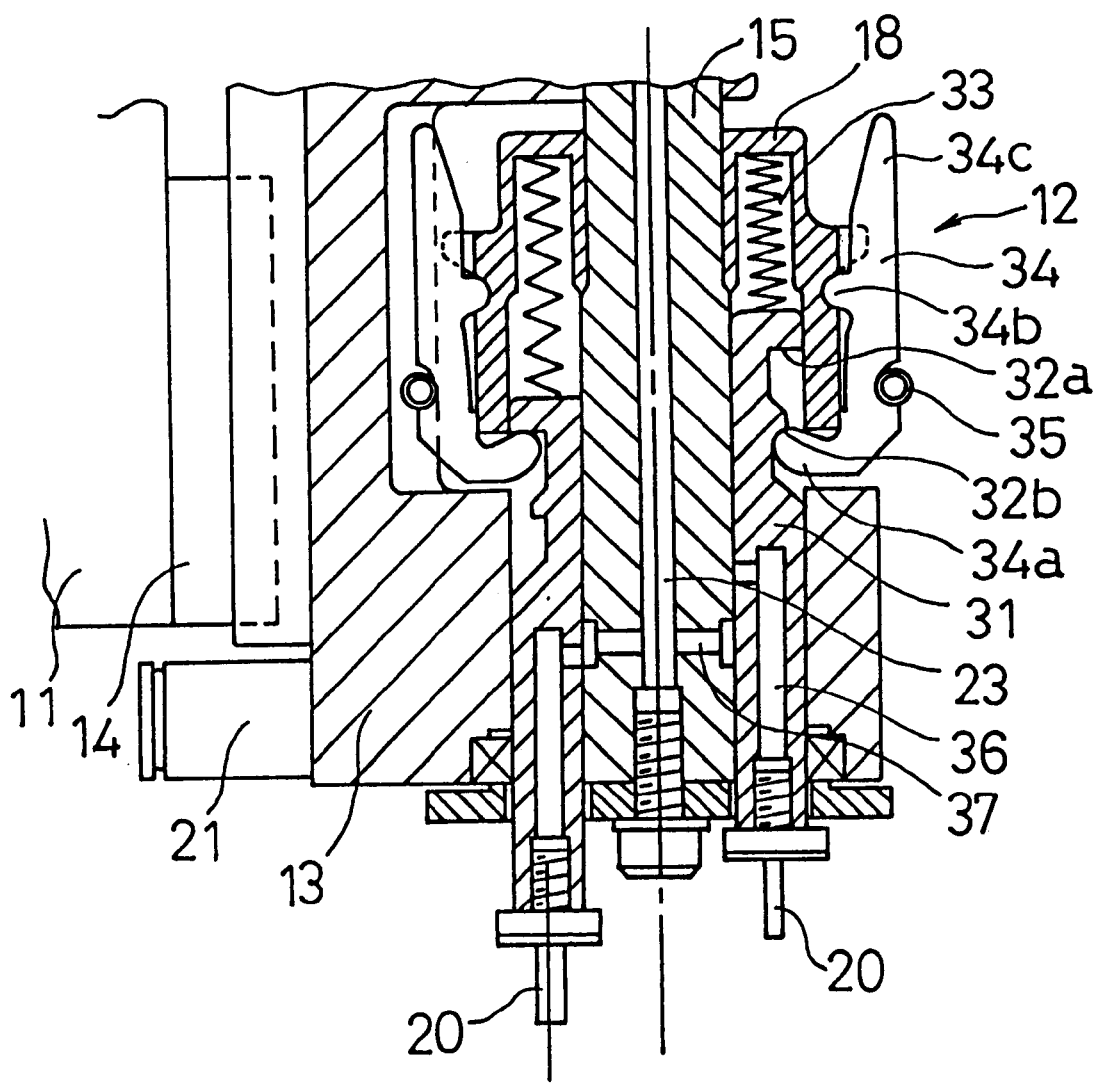
FIG. 5 is a front vertical section of a mounting head of an electronic component mounting device according to a further embodiment of the present invention.

In FIG. 5, suction nozzles 20 of plural types are provided on the outer circumference of a rotating unit 18 fixed to the lower end of a rotating shaft 15, in parallel with the axis of rotation thereof. Each suction nozzle 20 is installed on the lower end of a moving shaft 31 supported movably in a vertical direction on the outer circumference of the rotating unit 18, positioning steps 32a, 32b for halting each nozzle in a downward position or an upward position being provided on the upper portion of each moving shaft 31, and furthermore, a spring 33 pressing in a downward direction being inserted between the upper end of each moving shaft 31 and the rotating unit 18. Moreover, swingable engaging hooks 34 are provided around the outer circumference of the rotating unit 18 corresponding to each of the moving shafts 31, such as to be pivoted between a position where they engage with the positioning steps 32a, 32b and a position where they are released therefrom, and a ring spring 35 pressing towards the engagement position is fitted externally to the outer circumference thereof. Each engaging hook 34 comprises, at the lower end portion thereof, an engaging hook portion 34a corresponding to the positioning steps 32a, 32b, in the middle portion thereof, a projecting fulcrum portion 34b, and at the upper end portion thereof, a rocking operation lever 34c, such that the engaging hook portion 34a can be moved to the engagement release position by applying pressure to the rocking operation lever 34c, thereby allowing the moving shaft 31 to move to the downward position.

An air passage 36 connecting to the suction nozzle 20 is formed in the lower portion of the moving shaft 31, and an air passage 37 consisting of a radial groove and a circumferential annular groove is formed in the lower portion of the air passage 23 of the rotating shaft 15, in such a manner that when any one of the moving shafts 31 is engaged in the lower position, the air passage 36 in the moving shaft 31 and the air passages 37, 23 in the rotating shaft 15 are mutually connected. Consequently, by pressing on the rocking operation lever 34c of the engaging hook 34 and causing the moving shaft 31 to move to a downward position, it is possible to perform a suction operation by means of the corresponding suction nozzle 20.

In the present embodiment, by operating an engaging hook 34 corresponding to a suction nozzle 20 suited to a component type, the suction nozzle 20 in question is lowered and assumes an operational state, and in this state, the operational position of the suction nozzle 20 can be selected by rotating the rotating unit 18, thereby enabling similar suction or mounting operations as in the aforementioned embodiment to be carried out and hence displaying the merits of same.

Next, a further embodiment is described with reference to FIG. 6. Like elements having the same function as those in the foregoing embodiments are given the same reference numerals and description thereof is omitted, only the points of difference thereto being described here.

In FIG. 6, a rotating unit 18 fixed to the lower end of a rotating shaft 15 is constituted by a square U-shaped bracket having an open side facing downwards. A nozzle block 38, which can be located rotationally about a horizontal axis intersecting orthogonally the axis of rotation O and wherein suction nozzles 20 of plural types are arranged about the circumference thereof, is provided in such a manner that the plane in which these suction nozzles 20 are installed is displaced by an amount e from the rotational axis O of the rotating unit 18, it being possible to locate any desired suction nozzle 20 in a position parallel to the axis of rotation O by means of rotating the nozzle block 38.

In the present embodiment, a suitable suction nozzle 20 can be selected by rotating the nozzle block 38 in accordance with the type of component, and furthermore, the operating position of the suction nozzle 20 can be selected by rotating the rotating shaft 18, thereby enabling similar suction or mounting operations to the foregoing embodiments to be carried out and similar merits to be displayed.

Yet a further embodiment is now described with reference to FIG. 9 and FIG. 10.

Figure 9:
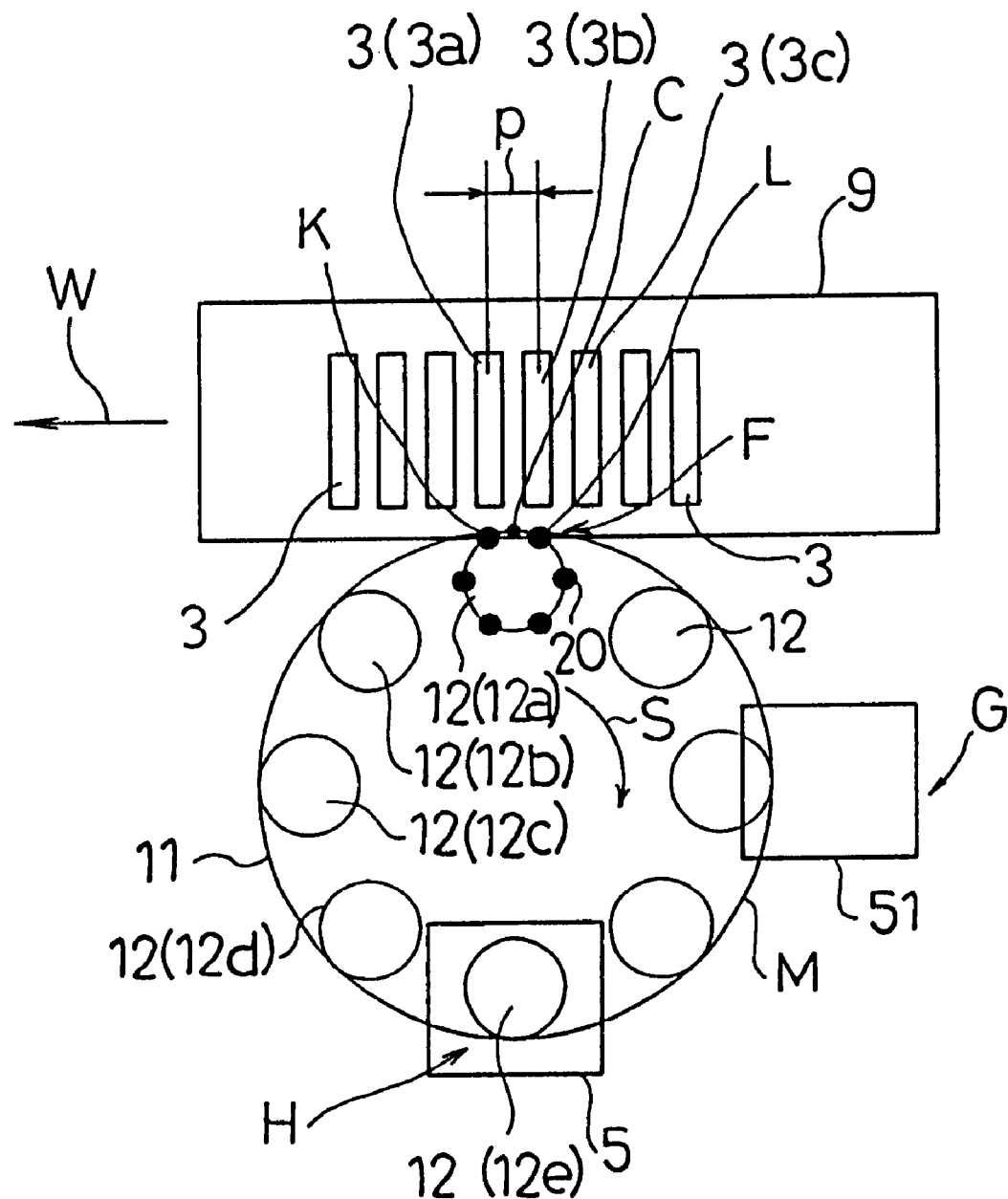
FIG. 9 is a schematic plan view showing yet a further embodiment of the present invention.

As shown in FIG. 9, the method for mounting components according to this embodiment is devised such that a plurality of mounting heads 12 provided on the circumference of a rotating table 11 which rotates intermittently in one direction S is caused to stop successively at a component supply position F, whilst, out of a plurality of component feeders 3 mounted in a sequential fashion on a component supply table 9 moving in a direction W and contacting the rotating edge M of the rotating table 11, component feeder 3 supplying a component which is to be picked up stops sequentially in a prescribed position, the component is picked up from the component feeder 3 by the suction nozzle 20 provided on the mounting head 12 at the aforementioned component supply position F, the mounting head 12 is moved by the intermittent rotation of the rotating table 11 to a component recognition position G, where the component held by suction is recognized by a component recognition camera 51, whereupon it moves to a component mounting position H, where the component held by suction is mounted to a substrate 5.

The mounting heads 12 are constituted in such a manner that, for the suction operating position by the suction nozzle 20 when the mounting head 12 is at rest at the component supply position F, it is possible to select one of two positions, namely, a first suction operating position K which is displaced upstream in the rotational direction S of the rotating table 11 from the reference point C where the rotating edge M of the rotating table 11 contacts the line of movement of the component supply table 9, and a second suction operating position L which is displaced downstream in the rotational direction S of the rotating table 11 from the aforementioned reference point C. Specifically, a mounting head as described previously with reference to FIG. 5 and a mounting head as shown in FIG. 1 may be used.

Component feeder 3 are arranged on the component supply table 9 at a pitch, p, and the component supply table 9 is moved at a pitch of P/2 in an opposite direction W to the rotational direction S of the rotating table 11.

The displacements from the reference point C of the aforementioned first suction operating position K and second suction operating position L are p/4, respectively.

In the first cycle shown in FIG. 10A, a mounting head 12a for which the first suction operating position K has been selected picks up a component Za from component feeder 3a located in a corresponding position;

in the second cycle shown in FIG. 10B, the second suction operating position L is selected for the next mounting head 12b reaching the component supply position F, and the mounting head 12b picks up a component Zb1 from the subsequent component feeder 3b which has been located in a corresponding position by a movement of pitch p/2.

in the third cycle shown in FIG. 10C, the first suction operating position K is selected for the third mounting head 12c reaching the component supply position F, and the mounting head 12c picks up another component Zb2 from the component feeder 3b used in the second cycle and located in a corresponding position by a movement of pitch p/2;

in the fourth cycle shown in FIG. 10D, the second suction operating position L is selected for the fourth mounting head 12 reaching the component supply position F, and the mounting head 12d picks up a component Zc1 from a third component feeder 3c which has been located in a corresponding position by a movement of pitch p/2;

and then, as shown in FIG. 10E, a component Zc2 is picked up from the third component feeder 3c by the next mounting head 12e reaching the component supply position F, in a similar manner to the first cycle, and thereafter the process of picking up components is carried out by repeating the aforementioned steps.

When the component suction operation in any of the first cycle–fourth cycle described above is repeated in a state where the component supply table 9 is at rest and not subjected to a pitch movement, then the corresponding suction operating position should be selected for the next mounting head 12 arriving at the component supply position F such that component supplied by the same component feeder 3 is picked up. For example, in a case where a component is picked up from the component feeder 3a for second time in the state shown in FIG. 10A, then component suction should be carried out by selecting the first suction operating position K for the next mounting head 12b.

In this way, by adopting the present embodiment, it is possible to set the amount of movement of the component feeder 3 in each cycle to half of the pitch p (p/2) between component feeder 3, thereby halving the amount of movement in comparison to the prior art. Since a plurality of component feeders 3 are mounted on the component supply table 9 and the inertia thereof is very large, the key point in reducing component mounting tact time has been reducing the amount of movement per cycle of the component supply table 9. According to the present embodiment, it is possible to reduce the pitch movement of the component supply table 9 by one half compared to the prior art, thereby enabling a large reduction in component mounting tact time to be achieved.

The present embodiment is premised on the fact that at least two or more components are picked up consecutively from the same component feeder 3. However, in cases where only one component is picked up from each component feeder 3, or in cases where the pitch between component feeder carrying large components is larger than p, for example, then the first cycle–fourth cycle described above cannot be used, and therefore the suction and mounting operations for the aforementioned special cases should be carried out after suction operations using the series of cycles described above have been completed.

If the pitch p between component feeder 9 mounted on the component supply table 9 is made smaller, then the amount of movement of the component supply table 9 per cycle can be reduced accordingly. Therefore, this method is suitable for use with a system wherein plural rows of component assembly tapes are provided in a single parts cassette (see Japanese Published Examined Patent Application No. 7-114319).

Next, yet a further embodiment is described with reference to FIG. 9 and FIG. 11.

In this embodiment, for the suction operating position for the suction nozzle 20 in a state where the mounting head 12 is at rest in the component supply position F, it is possible to select one of three positions, namely, a first suction operating position K which is displaced upstream in the rotational direction of the rotating table 11 from the reference point C where the rotating edge M of the rotating table 11 contacts the line of movement of the component supply table 9, a second suction operating position L which is displaced downstream in the rotational direction of the rotating table 11 from the aforementioned reference point C, and a third suction operating position C which is the position of the aforementioned reference point.

When the mounting head 12 has reached the component recognition position G, the suction nozzle 20 is moved to the aforementioned reference point C, regardless of the suction operating position, and its position is recognized by the component recognition camera 51. Moreover, when the mounting head 12 has reached the component mounting position H, the suction nozzle 20 is moved to the aforementioned reference point C and, after carrying out positional correction as required on the basis of data obtained from the component recognition camera 51, the component is mounted onto the substrate 5.

As shown in FIG. 10, for smaller components, component suction is carried out by selecting the first or second suction operating position K, L, thereby achieving a significant increase in mounting speed.

On the other hand, for larger components, (for example, components having sides of 5 mm or more,) component suction is carried out by selecting the third suction operating position C. This is in order to prevent larger components from being partially out of the field of view 51a of the recognition camera 51.

Figure 11A:
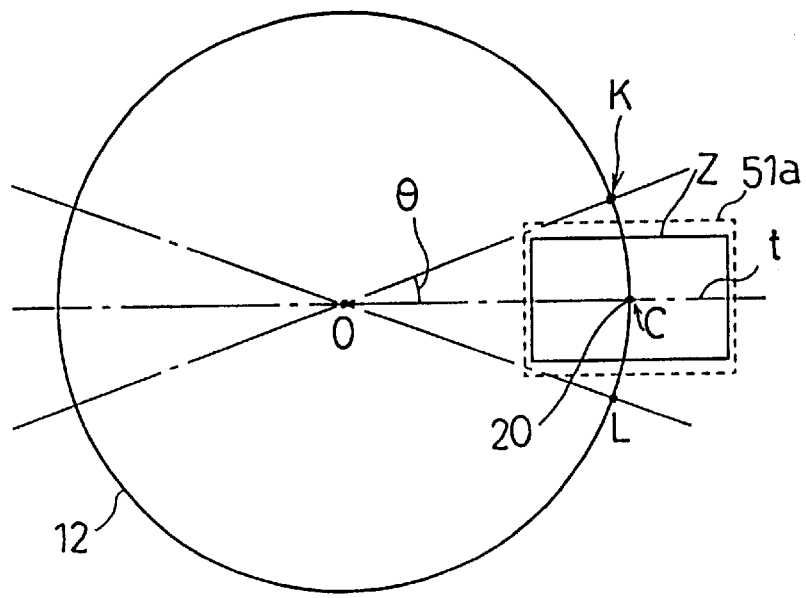
FIGS. 11A and 11B are illustrative diagrams showing the component mounting method by comparing two cases.
Figure 11B:
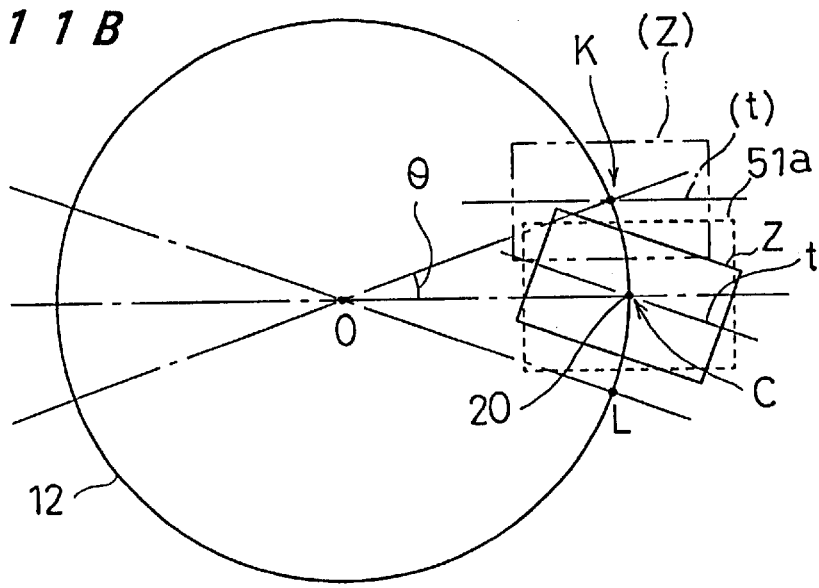

In other words, as shown in FIG. 11B, supposing that a large component Z is picked up at the first suction operating position K, and at the component recognition position G it is recognized by the recognition camera 51 in a state where the suction nozzle 20 has moved to the reference point C, then the attitude of the large component A will be inclined by the angle θ of movement of the suction nozzle 20, i.e., by the angle KOC in the figure. An angle of inclination corresponding to the aforementioned movement angle θ will thus occur between the reference center line of the field of view 51a of the recognition camera 51 and the reference center line t of the larger component Z, thereby causing a problem in that a portion of the larger component Z will lie outside the aforementioned field of view 51a.

However, if, as shown in FIG. 11A, the larger component Z is picked up at the third suction operating position C, then component recognition can be carried out in a state where the reference center line t of the larger component Z matches the reference center line of the aforementioned field of view 51a, and consequently the aforementioned problem can be eliminated.

According to the method for mounting components of the present invention, by using mounting heads for which a plurality of suction operating positions for suction nozzles are set and any of the set positions can be selected, it is possible to reduce the amount of movement of component feeder until reaching a component supply position, and consequently the movement time can be shortened accordingly and increased mounting speed can be achieved. In particular, by adopting pitch movement of the component supply table in a single direction and picking up a plurality of components from the same component feeder, it is also possible to halve the amount of movement of the component supply table per cycle, compared to the prior art, thereby enabling significant increases in mounting speed to be achieved.

Moreover, according to the component mounting device of the present invention, it is possible to achieve high-speed mounting by implementing the aforementioned methods.

While preferred embodiments of the invention have been described using specific terms, such description is for illustrative purposes only, and it is to be understood that changes and variations may be made without departing from the spirit or scope of the following claims.

What is claimed is:

1. A device for mounting components, whereby at least one of the components is picked up by one of a plurality of a suction nozzles provided in a mounting head which is movable intermittently by rotation along a uniform path, when said mounting head comes to rest in a prescribed component supply position, and one of the components held by suction is mountable to a substrate when the mounting head comes to rest in a prescribed component mounting position, wherein said device comprises:

a rotable member for supporting the movable mounting head with the plurality of suction nozzles;

a component supply table that is movable and supports a plurality of component feeders for supplying components spaced apart by a pitch of p;

a control unit for setting a plurality of suction nozzle operating positions for suction operations or mounting operations when the mounting head is at rest in the component supply position or the component mounting position, and selecting one of these suction nozzle operating positions, the control unit moving the component supply table to position one of the component feeders at a component supply position and moving the rotable member and the mounting head for selecting one of the suction nozzle operating positions including a first and second suction nozzle operating position, each separated by a length of ¼ p from a reference point which is a point where an edge of the rotable member contacts a line of movement of the component supply table and the component supply table moves a length of ½ p in each movement.

2. The device for mounting components according to claim 1, wherein the mounting head includes a nozzle block, which is capable of being positioned rotationally about an oblique axis of rotation intersecting obliquely with an axis of rotation of the rotating member and supports the plurality of suction nozzles of a plurality of different types arranged on a circumference thereof, provided on the rotating member, and a selected suction nozzle can be located selectively in a position by rotating the nozzle block.

3. The device for mounting components according to claim 1, wherein suction nozzles of plural types are provided on a circumference of the rotating member in parallel with an axis of rotation thereof, and a switching member for switching a vertical position of each suction nozzle is provided.

4. The device for mounting components according to claim 1, wherein a nozzle block, which is capable of being positioned rotationally about a horizontal axis of rotation intersecting orthogonally with an axis of rotation of the rotating member, supports the plurality of suction nozzles of a plurality of different types arranged on a circumference thereof, the nozzle block is provided on the rotating member, said nozzle block displaces a plane in which the suction nozzles are installed from an axis of rotation of the rotating member and any one of the suction nozzles can be located at a position parallel to the axis of rotation by rotating the nozzle block.

5. A device for mounting components, whereby a plurality of mounting heads provided on a circumference of a rotating table rotating intermittently in a single direction come to rest successively in a component supply position, a plurality of component feeders are mounted and spaced apart by a pitch of p in a sequential fashion on a component feeder table, the component feeder table moves in a direction adjacent the rotating edge of the rotating table, component feeder supply components that are to be picked up are provided in a prescribed position, a component being picked up from one of the component feeders by a suction nozzle provided in one of the mounting heads in the aforementioned component supplying position, and the component held by suction is recognized by a component recognition camera when the mounting head reaches a component recognition position by means of the intermittent rotation of the rotating table, whereupon the component held by suction is mounted to a substrate when the mounting head reaches a component mounting position, wherein the mounting heads used to provide the suction operating position for the suction nozzle when the mounting head is at rest in the component supply position, can permit a selection of any one of three positions from a first suction operating position displaced upstream in the direction of rotation of the rotating table from a reference point where the rotating edge of the rotating table contacts the line of movement direction of the component supply table, a second suction operating position displaced downstream in the direction of rotation of the rotating table from said reference point, and a third suction operating position, which is the position of the aforementioned reference point, and when the mounting head is in the component recognition position and the component mounting position, component recognition and component mounting are carried out by positioning the suction nozzle at the aforementioned reference point, regardless of the suction operating position, the first, second, and third suction operation positions are each separated by a length of ¼ p from a reference point which is the point where the edge of the rotating table contacts the line of movement of the component feeder table and the component feeder table moves a length of ½ p in each movement.

6. The device for mounting components according to claim 5, wherein the suction operating position is selected according to a size of the component imaged by the component recognition camera.

7. The device for mounting components according to claim 6, wherein a third suction operating position is selected for components having a length of 5 mm or greater.

8. A device for mounting components comprising:
a movable component supply table;
a plurality of component feeders spaced apart by a pitch of p on the movable component supply table for supplying the components;
a rotating member;
a mounting head movably mounted on the rotating member;
a plurality of suction nozzles that are movable on or with the mounting head, each suction nozzle being movable to any one of a first, second, and third suction operating position, wherein the third suction operation position is positioned at a reference point where a rotating edge of the rotating member contacts a line of movement of the component supply table, the first suction operation position is displaced upstream in a direction of rotation of the rotating member from the reference point, and the second suction operating position is displaced downstream in the direction of rotation of the rotating member from the reference point;
a component recognition unit for determining a type of component; and
a control unit for respectively
rotating the rotating member to position the mounting head at a component supply position to enable a component pickup from one of the plurality of component feeders;
positioning one of the plurality of suction nozzles on the mounting head to one of the first, second, and third suction operation positions for picking up the component from the component feeder, wherein the first and second suction operating positions are each separated by a length of ¼ p from the reference point which is the point where the edge of the rotating member contacts the line of movement of the component supply table and the component supply table moves a length of ½ p in each moving step;
rotating the rotating member after component pickup to position the mounting head at a component recognition position;
positioning the suction nozzle holding the component at the aforementioned reference point, regardless of the initial suction operating position for picking up the component, wherein the reference point lies on a reference center line of field of view of the recognition camera;
recognizing the component held by the suction nozzle with the recognition camera; and
mounting the component held by the suction nozzle on a substrate.

9. A device for mounting components comprising:
a rotating table member;
a mounting head movably mounted on an outer periphery of a rotating table;
a suction nozzle that is movable on or with the mounting head to any one of a first and second suction nozzle operating position relative to the rotating table;
a movable component supply table;
a plurality of movable component feeders spaced apart by a pitch of p on a movable component supply table for supplying the components;
a movable XY table for holding and positioning a substrate on which the components are to be mounted;
a control unit for respectively
selecting a suction nozzle position from the plurality of suction nozzle positions based on the suction nozzle position corresponding to a component supply position that minimizes movement of one of the plurality of component feeders;
moving the component feeder to the component supply position corresponding to the selected suction nozzle position wherein the first and second suction operating positions are each separated by a length of ¼ p from a reference point which is a point where an edge of the rotating table contacts a line of movement of the component supply table and the component supply table moves a length of ½ p in each moving step;
rotating the rotating table to position the mounting head at the component supply position;
picking up one of the components from the component feeder with the suction nozzle;
selecting a second suction nozzle position from the plurality of suction nozzle positions based on the suction nozzle position corresponding to a component mounting position that minimizes movement of the XY table;
moving the XY table to the component mounting position corresponding to the second selected suction nozzle position;
rotating the rotating table to position the mounting head at the component mounting position; and
mounting the component held by the suction nozzle on the substrate on the XY table.

10. A device for mounting components comprising:
a rotating table;
a plurality of mounting heads on an outer periphery of the rotating table, at least one suction nozzle movable on or with each mounting head;
a movable component supply table;
a plurality of component feeders spaced apart by a pitch of p on the movable component supply table, wherein each suction nozzle is movable on the respective mounting head to any one of a first and second suction operating position relative to the rotating table; and
a control unit for respectively
selecting the first suction operating position for a first suction nozzle in a first cycle;
picking up a first component from a first component feeder with the first suction nozzle at a component supply position corresponding to the first suction operating position;
selecting the second suction operating position for a second suction nozzle in a second cycle;
moving the supply table to position a second component feeder at a component supply position corresponding to the second suction operating position;
rotating the rotating table to position the second nozzle at the component supply position corresponding to the second suction operating position;
picking up a second component from the second component feeder with the second suction nozzle;
selecting the first suction operating position for a third suction nozzle in a third cycle;
moving the supply table to position the second component feeder at the component supply position corresponding to the first suction operating position;
rotating the rotating table to position the third suction nozzle at the component supply position corresponding to the first suction operating position;

picking up the third component from the second component feeder with to the third suction nozzle;

selecting the second suction operating position for a fourth suction nozzle in a fourth cycle;

moving the supply table to position a third component feeder at the component supply position corresponding to the second suction operating position wherein the first and second suction operating positions are each separated by a length of ¼ p from a reference point which is a point where an edge of the rotating table contacts a line of movement of the component supply table and the component supply table moves a length of ½ p in each moving step;

rotating the rotating table to the component supply position corresponding to the second suction operating position; and picking up a fourth component from the third component feeder with the fourth suction nozzle position.

* * * * *